(12) United States Patent
Kim et al.

(10) Patent No.: US 10,141,348 B2
(45) Date of Patent: Nov. 27, 2018

(54) DISPLAY DEVICE AND METHOD OF MANUFACTURING THE SAME

(71) Applicant: Samsung Display Co., Ltd, Yongin-si, Gyeonggi-do (KR)

(72) Inventors: Seul Ki Kim, Incheon (KR); Seung Ha Choi, Hwaseong-si (KR); Hyun Kim, Suwon-si (KR); Yun Seok Han, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/413,055

(22) Filed: Jan. 23, 2017

(65) Prior Publication Data

US 2017/0317105 A1 Nov. 2, 2017

(30) Foreign Application Priority Data

Apr. 28, 2016 (KR) .................. 10-2016-0052185

(51) Int. Cl.
*H01L 29/04* (2006.01)
*H01L 29/10* (2006.01)
(Continued)

(52) U.S. Cl.
CPC .......... *H01L 27/124* (2013.01); *G02F 1/1337* (2013.01); *G02F 1/1368* (2013.01); *G02F 1/13394* (2013.01); *G02F 1/13439* (2013.01); *G02F 1/133345* (2013.01); *G02F 1/134309* (2013.01); *G02F 1/136227* (2013.01); *G02F 1/136286* (2013.01); *H01L 27/1248* (2013.01);
(Continued)

(58) Field of Classification Search
CPC .......... G02F 1/13394; G02F 1/136227; G02F 1/136286; G02F 1/1368; G02F 1/133345; G02F 1/1337; G02F 1/134309; G02F 1/13439; G02F 2001/13396; G02F 2001/134318; G02F 2201/121; G02F 2201/122
See application file for complete search history.

(56) References Cited

U.S. PATENT DOCUMENTS

2013/0140571 A1* 6/2013 Imai .................. H01L 33/0041
257/59

FOREIGN PATENT DOCUMENTS

| KR | 10-2013-0015245 A | 2/2013 |
| KR | 10-2014-0122623 A | 10/2014 |
| KR | 10-2017-0043117 A | 4/2017 |

* cited by examiner

*Primary Examiner* — Meiya Li
(74) *Attorney, Agent, or Firm* — Innovation Counsel LLP

(57) ABSTRACT

Provided are a display device its method of manufacturing. The device includes a base; first and second thin-film transistors (TFT) on the base, adjacent to each; an organic layer covering the first and second TFT, including a first and second opening overlapping the drain electrodes of the first and second TFT, respectively; a common electrode on the organic layer comprising a common electrode opening overlapping the first opening and another common electrode opening overlapping the second opening; an insulating layer on a bump spacer which is on the common electrode; a first and second pixel electrode on the insulating layer overlapping the common electrode and electrically connected to the first and second TFT, respectively, wherein a minimum distance between the bump spacer and the common electrode opening is substantially equal to a minimum distance between the bump spacer and the other common electrode opening.

17 Claims, 13 Drawing Sheets

(51) Int. Cl.
*H01L 31/00* (2006.01)
*H01L 27/12* (2006.01)
*G02F 1/1333* (2006.01)
*G02F 1/1337* (2006.01)
*G02F 1/1339* (2006.01)
*G02F 1/1343* (2006.01)
*G02F 1/1362* (2006.01)
*G02F 1/1368* (2006.01)

(52) U.S. Cl.
CPC .................. *H01L 27/1288* (2013.01); *G02F 2001/13396* (2013.01); *G02F 2001/134318* (2013.01); *G02F 2201/121* (2013.01); *G02F 2201/122* (2013.01); *G02F 2201/123* (2013.01); *G02F 2202/02* (2013.01)

DISPLAY DEVICE AND METHOD OF MANUFACTURING THE SAME

This application claims priority from Korean Patent Application No. 10-2016-0052185 filed on Apr. 28, 2016 in the Korean Intellectual Property Office, the disclosure of which is incorporated herein by reference in its entirety.

BACKGROUND OF THE INVENTION

1. Field of the Invention

The inventive concept relates to a display device and a method of manufacturing the same.

2. Description of the Related Art

A liquid crystal display (LCD) is a display device that may typically include two substrates which face each other and a liquid crystal layer which is interposed between the two substrates. Since a thickness of the liquid crystal layer can determine transmittance of light that passes through the liquid crystal layer, a spacer is placed between the two substrates to maintain a uniform gap between the two substrates.

When an external force is applied to the LCD, the spacer can be deformed by the external force. Accordingly, the gap between the two substrates can be changed, which, in turn, changes light transmittance of the liquid crystal layer. In addition, the spacer can be moved laterally by the external force. Therefore, there is a possibility that any one of the two substrates can be damaged.

SUMMARY OF THE INVENTION

Aspects of the inventive concept provide a display device which can maintain a uniform gap between two substrates and has improved reliability and a method of manufacturing the display device.

Aspects of the inventive concept also provide a display device which can maintain a uniform gap between two substrates and prevent an increase in the number of manufacturing processes and a method of manufacturing the display device.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a display device. The display device includes a first base; a first thin-film transistor (TFT) and a second TFT which are disposed on the first base to be adjacent to each other along a first direction; an organic layer which covers the first TFT and the second TFT and comprises a first opening overlapping a first drain electrode of the first TFT and a second opening overlapping a second drain electrode of the second TFT; a common electrode which is located on the organic layer and comprises a first common electrode opening overlapping the first opening and a second common electrode opening overlapping the second opening; a bump spacer which is located on the common electrode; an insulating layer which is located on the common electrode and the bump spacer; a first pixel electrode which is disposed on the insulating layer to overlap the common electrode and is electrically connected to the first TFT; and a second pixel electrode which is disposed on the insulating layer to overlap the common electrode and is electrically connected to the second TFT, wherein a minimum distance between the bump spacer and the first common electrode opening is substantially equal to a minimum distance between the bump spacer and the second common electrode opening when seen from above.

The display device may have a planar shape of the first opening substantially identical to that of the first common electrode opening, and a planar shape of the second opening substantially identical to that of the second common electrode opening.

The display device may have a side surface of the first opening and a side surface of the first common electrode opening substantially collinear, and a side surface of the second opening and a side surface of the second common electrode opening substantially collinear.

The display device may have a maximum width of the first common electrode opening in the first direction substantially equal to that of the first opening in the first direction, and a maximum width of the second common electrode opening in the first direction substantially equal to that of the second opening in the first direction.

The display device may have the bump spacer not overlap the first common electrode opening nor the second common electrode opening.

The display device may have a minimum distance between the first common electrode opening and the second common electrode opening equal to or greater than a width of the bump spacer in the first direction.

The display device may have a minimum distance between the bump spacer and the first opening is substantially equal to a minimum distance between the bump spacer and the second opening.

The display device may have the insulating layer comprises a first contact hole which exposes the first drain electrode and overlaps the first opening and the first common electrode opening and a second contact hole which exposes the second drain electrode and overlaps the second opening and the second common electrode opening, wherein the first pixel electrode is connected to the first drain electrode of the first TFT by the first contact hole, the first common electrode opening and the first opening, and wherein the second pixel electrode is connected to the second drain electrode of the second TFT by the second contact hole, the second common electrode opening and the second opening.

The display device may further include a gate line which is located on the first base and extends in the first direction; and a first data line and a second data line which are located on the first base and insulated from the gate line to extend in a second direction intersecting the first direction, and the first TFT may be electrically connected to the gate line and the first data line, and the second TFT may be electrically connected to the gate line and the second data line.

The display device may further include a second base which faces the first base; and a spacer which is located on a surface of the second base facing the first base and which overlaps the bump spacer.

The display device may further include a first alignment layer which is located on the insulating layer and covers the first pixel electrode and the second pixel electrode; and a second alignment layer which is located on the surface of the second base and covers the spacer, wherein the first alignment layer and the second alignment layer contact each other between the spacer and the bump spacer.

According to another aspect of the inventive concept, there is provided a display device. The display device includes a first base; a TFT which is located on the first base; an organic layer which covers the TFT and has an opening overlapping a drain electrode of the TFT; a common electrode which is located on the organic layer and has a common electrode opening overlapping the opening; a bump spacer which is located on the common electrode; an insulating layer which is located on the common electrode and the bump spacer; and a pixel electrode which is disposed on the insulating layer to overlap the common electrode and is electrically connected to the TFT, wherein a planar shape of the opening is substantially identical to that of the common electrode opening.

The display device may have a side surface of the common electrode opening and a side surface of the opening substantially collinear.

The display device may have the bump spacer not overlap the common electrode opening.

The display device may have a maximum width of the common electrode opening substantially equal to that of the opening.

The display device may further include a second base which faces the first base; and a spacer which is located on a surface of the second base facing the first base and overlaps the bump spacer.

The display device may further include a first alignment layer which is located on the insulating layer and covers the pixel electrode; and a second alignment layer which is located on the surface of the second base and covers the spacer, wherein the first alignment layer and the second alignment layer contact each other between the spacer and the bump spacer.

According to another aspect of the inventive concept, there is provided a method of manufacturing a display device, including: forming a TFT on a first base; forming an organic layer which covers the TFT; forming a common electrode conductive layer on the organic layer; forming a bump organic layer on the common electrode conductive layer; forming a first photoresist pattern and a second photoresist pattern thicker than the first photoresist pattern on the bump organic layer; patterning the bump organic layer using the first photoresist pattern and the second photoresist pattern as a mask; forming a common electrode having a common electrode opening by patterning the common electrode conductive layer using the first photoresist pattern and the second photoresist pattern as a mask; forming a bump spacer by patterning the bump organic layer using the second photoresist pattern as a mask and, at the same time, forming an opening which exposes a drain electrode of the TFT by patterning the organic layer using the common electrode as a mask; forming an insulating layer on the bump spacer and the organic layer, wherein the insulating layer has a contact hole; and forming a pixel electrode, which is electrically connected to the TFT, on the insulating layer.

The method may be where forming of the first photoresist pattern and the second photoresist pattern thicker than the first photoresist pattern on the bump organic layer includes: forming a photoresist layer on the bump organic layer; exposing the photoresist layer to light using a halftone mask; and developing the exposed photoresist layer.

The method may be where forming of the bump spacer further comprises removing a portion of the first photoresist pattern and a portion of the bump organic layer which is located under the first photoresist pattern.

Other features and aspects will be apparent from the following detailed description, the drawings, and the claims.

BRIEF DESCRIPTION OF THE DRAWINGS

The above and other aspects and features of the inventive concept will become more apparent by describing in detail exemplary embodiments thereof with reference to the attached drawings, in which.

DETAILED DESCRIPTION OF THE INVENTION

Figure 1:
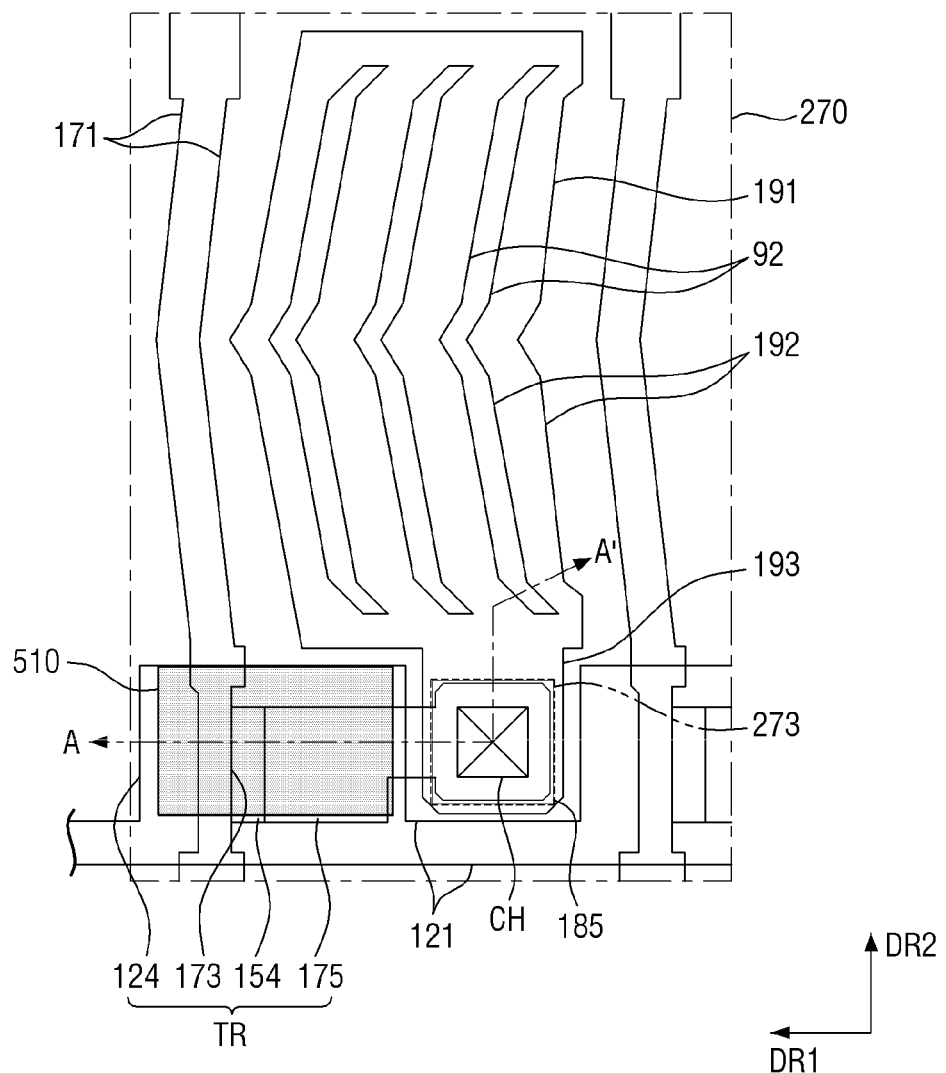
FIG. 1 is a layout view of one pixel included in a display device according to an embodiment of the inventive concept.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Like reference characters are used throughout the specification to indicate like or similar elements.

Hereinafter, embodiments of the inventive concept will be described with reference to the attached drawings.

Figure 2:
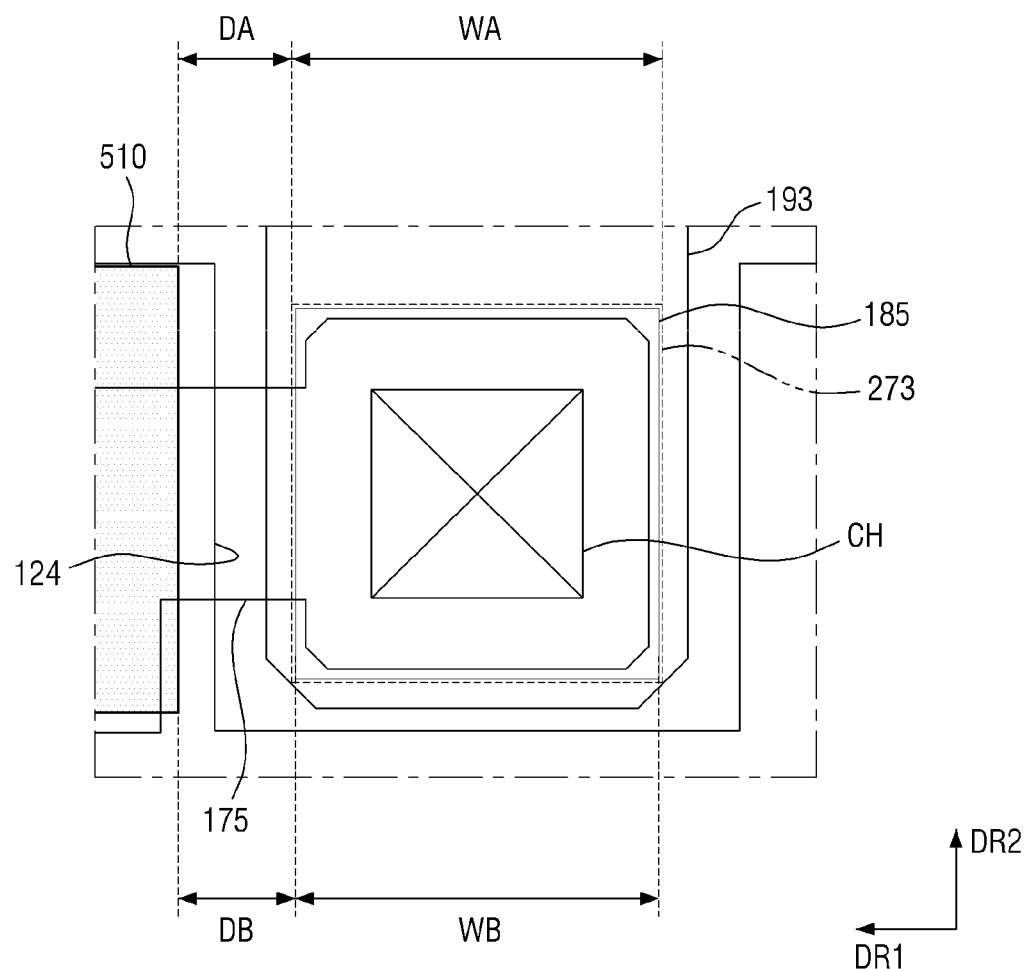
FIG. 2 is an enlarged view of an area around a contact hole in the display device of FIG. 1.
Figure 3:
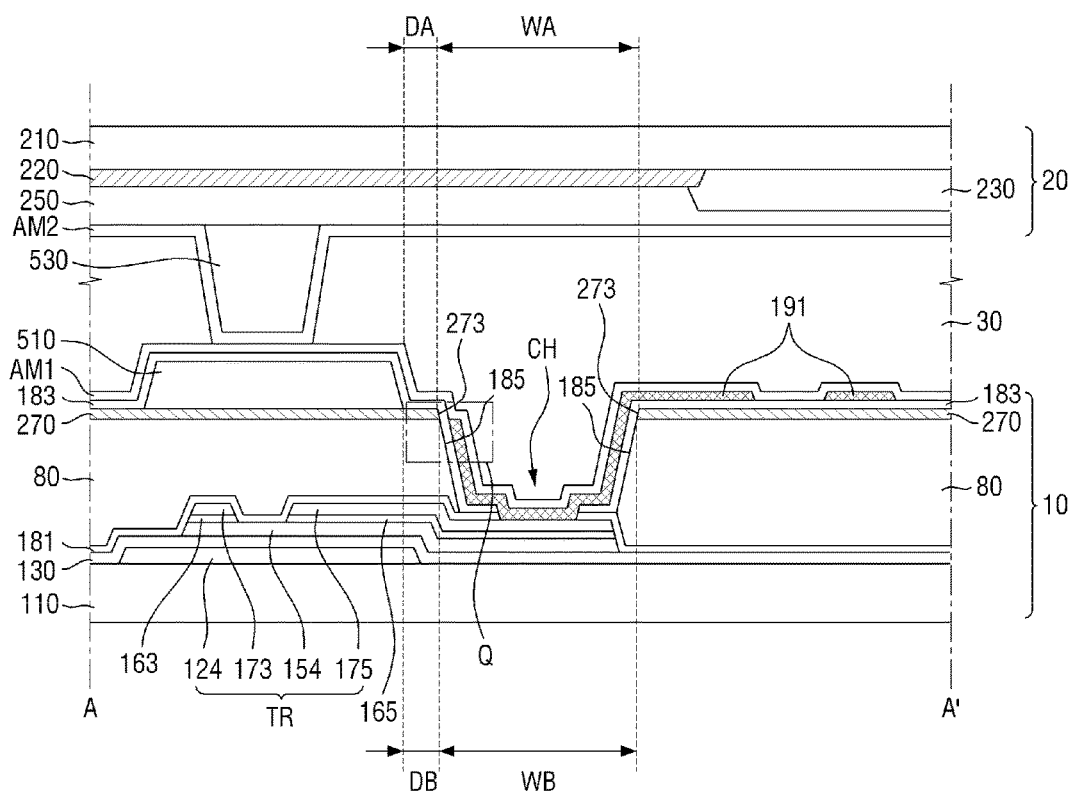
FIG. 3 is a cross-sectional view of the display device taken along the line A-A' of FIG. 1.
Figure 4:
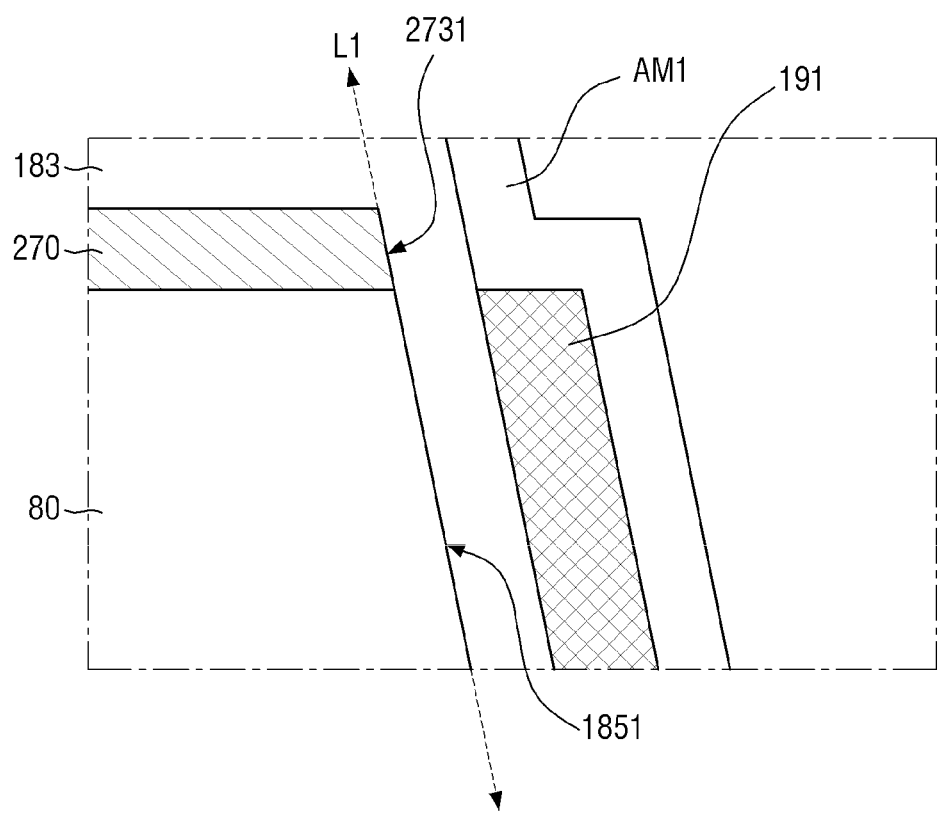
FIG. 4 is an enlarged cross-sectional view of a portion Q of FIG. 3.

FIG. 1 is a layout view of one pixel included in a display device according to an embodiment of the inventive concept. FIG. 2 is an enlarged view of an area around a contact hole CH in the display device of FIG. 1. FIG. 3 is a cross-sectional view of the display device taken along the line A-A' of FIG. 1. FIG. 4 is an enlarged cross-sectional view of a portion Q of FIG. 3.

Referring to FIGS. 1 through 4, the display device according to the current embodiment may include a first substrate 10, a second substrate 20, a liquid crystal layer 30, and a spacer 530.

The first substrate 10 may be a thin-film transistor (TFT) array substrate on which switching devices (e.g., TFTs) for driving liquid crystal molecules of the liquid crystal layer 30 are formed.

The second substrate 20 may be a substrate which faces the first substrate 10.

The liquid crystal layer 30 may include a plurality of liquid crystal molecules having dielectric anisotropy. When an electric field is applied between the first substrate 10 and the second substrate 20, the liquid crystal molecules may rotate in a certain direction between the first substrate 10 and the second substrate 20, thereby transmitting or blocking light. Here, when the liquid crystal molecules rotate, they may not only substantially rotate, but also the arrangement of the liquid crystal molecules may be changed by the electric field.

The first substrate 10 will hereinafter be described.

A first base 110 may be an insulating substrate. For example, the first base 110 may be a glass substrate, a quartz substrate, or a transparent resin substrate. In addition, the first base 110 may include polymer or plastic having high thermal resistance.

In some embodiments, the first base 110 may have flexibility. That is, the first substrate 100 may be a deformable substrate that can be rolled, folded or bent.

A gate line 121 and a gate electrode 124 may be located on the first base 110. The gate line 121 may deliver a gate signal and extend substantially in a first direction DR1. The gate electrode 124 may protrude from the gate line 121 and may be connected to the gate line 121. The gate line 121 and the gate electrode 124 may be made of aluminum (Al)-based metal such as aluminum or an aluminum alloy, silver (Ag)-based metal such as silver or a silver alloy, copper (Cu)-based metal such as copper or a copper alloy, molybdenum (Mo)-based metal such as molybdenum or a molybdenum alloy, chrome (Cr), titanium (Ti), or tantalum (Ta). In addition, the gate line 121 and the gate electrode 124 may have a single layer structure or a multilayer structure composed of at least two conductive layers with different physical characteristics.

A gate insulating layer 130 may be located on the gate line 121 and the gate electrode 124. The gate insulating layer 130 may be made of an insulating material. In an example, the gate insulating layer 130 may be made of silicon nitride, silicon oxide, or silicon oxynitride. The gate insulating layer 130 may have a single layer structure or a multilayer structure composed of at least two insulating layers with different physical characteristics.

A semiconductor layer 154 may be located on the gate insulating layer 130, and at least part of the semiconductor layer 154 may overlap the gate electrode 124. The semiconductor layer 154 may include amorphous silicon, polycrystalline silicon, or an oxide semiconductor.

A plurality of ohmic contact members 163 and 165 may be located on the semiconductor layer 154. The ohmic contact members 163 and 165 may include a source ohmic contact member 163 located under a source electrode 173 and a drain ohmic contact member 165 located under a drain electrode 175. The ohmic contact members 163 and 165 may be made of n+ hydrogenated amorphous silicon heavily doped with an n-type impurity, or may be made of silicide.

The source electrode 173 may be located on the source ohmic contact member 163, the drain electrode 175 may be located on the drain ohmic contact member 165, and a data line 171 may be located on the gate insulating layer 130.

The data line 171 may deliver a data voltage and extend substantially in a second direction DR2 intersecting the first direction DR1 to cross the gate line 121. In some embodiments, the data line 171 may define a pixel area by intersecting the gate line 121. In some embodiments, the data line 171 may be bent periodically in order to improve transmittance of the display device. In an example, the data line 171 may be bent in a 'V' shape in order to obtain maximum transmittance of the display device as illustrated in FIG. 1.

In some embodiments, when the semiconductor layer 154 is an oxide semiconductor, the ohmic contact members 163 and 165 may be omitted.

The source electrode 173 may be connected to the data line 171 and overlap the gate electrode 124. In some embodiments, the source electrode 173 may not protrude from the data line 171 but may be substantially collinear with the data line 171 as illustrated in FIG. 1. However, the inventive concept is not limited thereto, and the source electrode 173 can also protrude from the data line 171 onto the gate electrode 124.

The drain electrode 175 may be disposed on the gate electrode 124 to be separated from the source electrode 173 and to face the source electrode 173.

The data line 171, the source electrode 173 and the drain electrode 175 may be made of aluminum, copper, silver, molybdenum, chrome, titanium, tantalum or an alloy of these metals. In addition, each of the data line 171, the source electrode 173 and the drain electrode 175 may have a multilayer structure composed of a lower layer (not illustrated) made of refractory metal and an upper layer (not illustrated) made of a material with low resistivity. However, the inventive concept is not limited thereto, and each of the data line 171, the source electrode 173 and the drain electrode 175 can be made of various metals or conductors.

The gate electrode 124, the source electrode 173 and the drain electrode 175 may form a switching device, e.g., a TFT TR together with the semiconductor layer 154.

A passivation layer 181 may be located on the first base 110 having the TFT TR. The passivation layer 181 may include an organic insulating material or an inorganic insulating material such as silicon oxide, silicon nitride or silicon oxynitride. The passivation layer 181 may protect the TFT TR and prevent the introduction of material contained in an organic layer 80 into the semiconductor layer 154.

The organic layer 80 may be located on the passivation layer 181. In some embodiments, the organic layer 80 may planarize an upper surface of the passivation layer 181. In some embodiments, the organic layer 80 may be made of photosensitive organic matter.

In some other embodiments, the organic layer 80 may further include chromatic pigments. For example, the organic layer 80 may include chromatic pigments, each passing through light of a wavelength of a particular color. That is, the organic layer 80 may include a plurality of color filters. In an exemplary embodiment, any one of the color filters may display one of primary colors, i.e., red, green and blue. When the organic layer 80 includes chromatic pigments, a plurality of color filters 230 of the second substrate 20 which will be described later can be omitted. However, the inventive concept is not limited thereto. In another embodiment, a color filter different from the organic layer 80 can also be located on the first substrate 10.

The organic layer 80 may include an opening 185 which overlaps the drain electrode 175 of the TFT TR.

A common electrode 270 may be located on the organic layer 80. The common electrode 270 may have a planar shape and may be formed as a whole plate on the first base 110. In addition, the common electrode 270 may receive a common voltage Vcom of a certain magnitude. In some embodiments, the common electrode 270 may be made of a transparent conductive material. In an example, the transparent conductive material may be indium tin oxide (ITO), indium zinc oxide (IZO), indium tin zinc oxide (ITZO) or aluminum-doped zinc oxide (AZO).

The common electrode 270 may include a common electrode opening 273 which overlaps the drain electrode 175.

The common electrode opening 273 may overlap the opening 185 of the organic layer 80. A planar shape of the common electrode opening 273 may be substantially identical to that of the opening 185 as illustrated in FIGS. 1 and 2. In addition, the area of the common electrode opening 273 may be substantially equal to that of the opening 185 when seen from above (or in a plan view).

In some embodiments, a side surface 2731 of the common electrode opening 273 and a side surface 1851 of the opening 185 may lie on substantially the same straight line L1. In an example, the opening 185 may be formed by patterning the organic layer 80 using the common electrode 270 having the common electrode opening 273 as a mask. Therefore, in some embodiments, the side surface 2731 of the common electrode opening 273 and the side surface 1851 of the opening 185 may lie on substantially the same straight line L1.

A maximum width WB of the opening 185 may be substantially equal to a maximum width WA of the common electrode opening 273. For example, assuming that each of the opening 185 and the common electrode opening 273 has the maximum width WB or WA along the first direction DR1 when seen from above, the maximum width WA of the common electrode opening 273 may be substantially equal to the maximum width WB of the opening 185. As described above, the opening 185 may be formed by patterning the organic layer 80 using the common electrode 270 having the common electrode opening 273 as a mask. Therefore, the maximum width WA of the common electrode opening 273 may be substantially equal to the maximum width WB of the opening 185.

A bump spacer 510 which protrudes toward the second substrate 20 may be located on the common electrode 270. The common electrode 270 can prevent the organic layer 80 from being damaged in the process of forming the bump spacer 510.

The bump spacer 510 may overlap a light-blocking member 220 which will be described later. In addition, in some embodiments, the bump spacer 510 may overlap the TFT TR.

The bump spacer 510 may not overlap the opening 185 and the common electrode opening 273.

A distance between the bump spacer 510 and the common electrode opening 273 may be substantially equal to a distance between the bump spacer 510 and the opening 185. For example, when seen from above, a minimum distance DA between the bump spacer 510 and the common electrode opening 273 may be substantially equal to a minimum distance DB between the bump spacer 510 and the opening 185.

In an exemplary embodiment, the bump spacer 510 may be made of organic matter. In some embodiments, the bump spacer 510 may be made of photosensitive organic matter.

Since the common electrode 270 is located between the organic layer 80 and the bump spacer 510, each of the organic layer 80 and the bump spacer 510 can be easily formed to a desired thickness. That is, after the organic layer 80 is formed to a desired thickness, the common electrode 270 and the bump spacer 510 can be formed. That is, a process of forming the organic layer 80 and a process of forming the bump spacer 510 can be performed independently of each other and do not affect each other. Therefore, even if, e.g., a patterning process is performed in the process of forming the bump spacer 510, the organic layer 80 may not be damaged, and the thickness of the organic layer 80 can be maintained at a desired level because the organic layer 80 is protected by the common electrode 270. Further, since the thickness of the bump spacer 510 can be controlled independently of the thickness of the organic layer 80, the bump spacer 510 can be easily formed to a desired thickness.

An insulating layer 183 may be located on the common electrode 270 and the bump spacer 510 to cover the common electrode 270 and the bump spacer 510. The insulating layer 183 may be made of an organic insulating material or an inorganic insulating material such as silicon oxide, silicon nitride or silicon oxynitride.

The contact hole CH which exposes the drain electrode 175 may be formed in the passivation layer 181 and the insulating layer 183. The contact hole CH may overlap the opening 185 of the organic layer 80 and the common electrode opening 273 of the common electrode 270, and the drain electrode 175 may be exposed through the contact hole CH, the opening 185 and the common electrode opening 273.

A pixel electrode 191 may be located on the insulating layer 183. The pixel electrode 191 may be insulated from the common electrode 270 by the insulating layer 183 interposed therebetween. The pixel electrode 191 may overlap the common electrode 270. The pixel electrode 191 may include a plurality of branch electrodes 192 which overlap the common electrode 270, and a slit 92 may be formed between each pair of neighboring branch electrodes 192.

In some embodiments, the branch electrodes 192 of the pixel electrode 191 may extend substantially side by side with the data line 171. The branch electrode 192 may slope at an oblique angle to a vertical direction and may be bent at a horizontal centerline (not illustrated) of the pixel electrode 191. Accordingly, the pixel electrode 191 may be divided into a plurality of domains in which the branch electrodes 192 slope in different directions.

The pixel electrode 191 includes an extension part 193 which extends toward the drain electrode 175. The extension part 193 of the pixel electrode 191 may be physically and electrically connected to the drain electrode 175 by the contact hole CH, the opening 185 and the common electrode opening 273 to receive a data voltage from the drain electrode 175. The pixel electrode 191 may be made of a transparent conductive material such as ITO, IZO, ITZO, or AZO.

In some embodiments, a first alignment layer AM1 may further be located on an upper side of the first substrate 10, more specifically, on the insulating layer 183 and the pixel electrode 191. The first alignment layer AM1 may be made of, but is not limited to being made of, organic matter such as polyimide. In some embodiments, the first alignment layer AM1 may be a horizontal alignment layer and may be rubbed in a certain direction. Alternatively, the first alignment layer AM1 may include a photoreactive material so as to be photo-aligned.

The second substrate 20 and the spacer 530 will hereinafter be described.

The second substrate 20 may include a second base 210, the light-blocking member 220 and the color filters 230 and may further include an overcoat layer 250.

Like the first base 110, the second base 210 may be a transparent insulating substrate. In addition, the second base 210 may include polymer or plastic having high thermal resistance. In some embodiments, the second base 210 may have flexibility.

The light-blocking member 220 may be located on the second base 210. In some embodiments, the light-blocking member 220 may overlap the TFT TR, the contact hole CH, the opening 185, the common electrode opening 273, the gate line 121, and the data line 171. The light-blocking member 220 may include a light-blocking pigment such as black carbon or an opaque material such as chrome (Cr).

The color filters 230 may be located on the second base 210. the color filters 230 may overlap the pixel electrode 191. Each of the color filters 230 may be made of a material that contains a pigment for adding a color to photosensitive organic matter. For example, each of the color filters 230 may include any one of red, green and blue pigments in photosensitive organic matter. However, the inventive concept is not limited thereto. In some other embodiments, if the organic layer 80 includes chromatic pigments, the color filters 230 can be omitted.

The overcoat layer 250 may be located on the color filters 230 and the light-blocking member 220. In some embodiments, the overcoat layer 250 may be made of an organic insulating material. The overcoat layer 250 can be omitted if necessary.

The spacer 530 may be located between the first substrate 10 and the second substrate 20. The spacer 530 may protrude toward the first substrate 10. In some embodiments, the spacer 530 may be located on the overcoat layer 250. However, the inventive concept is not limited thereto. When the overcoat layer 250 is omitted, the spacer 530 can be located directly on the light-blocking member 220. In some embodiments, the spacer 530 may be made of an organic insulating material and have photosensitivity. In addition, in some embodiments, the spacer 530 may include a light-blocking pigment.

The spacer 530 may overlap the bump spacer 510 and the light-blocking member 220.

The spacer 530 and the bump spacer 510 may maintain a desired gap between the first substrate 10 and the second substrate 20. Accordingly, a thickness of the liquid crystal layer 30 can be maintained at a desired level. The thickness of the liquid crystal layer 30 can affect light transmittance. Therefore, maintaining the thickness of the liquid crystal layer 30 at a desired level may be an important factor for maintaining display quality. Since the spacer 530 and the bump spacer 510 maintain a desired gap between the first substrate 10 and the second substrate 20 as described above, they can contribute to maintaining the thickness of the liquid crystal layer 30 at a desired uniform level.

In addition, since the common electrode 270 is located between the organic layer 80 and the bump spacer 510, the thickness of each of the organic layer 80 and the bump spacer 510 can be maintained at a desired level. This can contribute to maintaining a desired gap between the first substrate 10 and the second substrate 20, thereby preventing degradation of display quality.

A second alignment layer AM2 may further be located on the second substrate 20 and the spacer 530. In some embodiments, the second alignment layer AM2 may include, but is not limited to including, organic matter. The second alignment layer AM2 may be substantially identical or similar to the first alignment layer AM1 described above.

In some embodiments, the first alignment layer AM1 and the second alignment layer AM2 may contact each other between the spacer 530 and the bump spacer 510. However, the inventive concept inventive concept is not limited thereto. According to structural modifications, any one of the first alignment layer AM1 and the second alignment layer AM2 can be located between the spacer 530 and the bump spacer 510. In an example, if only the first alignment layer AM1 is located between the spacer 530 and the bump spacer 510, it may directly contact the spacer 530 between the spacer 530 and the bump spacer 510. Alternatively, according to structural modifications, both the first alignment layer AM1 and the second alignment layer AM2 may exist between the spacer 530 and the bump spacer 510. In this case, the spacer 530 may directly contact the insulating layer 183 located on the bump spacer 510. Alternatively, if a portion of the insulating layer 183 which is located on the bump spacer 510 is removed, the bump spacer 510 and the spacer 530 may directly contact each other.

In the display device according to the current embodiment, the bump spacer 530 is located to overlap the spacer 510. This provides an additional advantage of preventing the first alignment layer AM1 from being damaged by the horizontal movement of the spacer 510.

In the following description, a description of elements already described above will be given briefly or omitted. Thus, the following description will focus on differences from the above-described embodiment.

Figure 5:
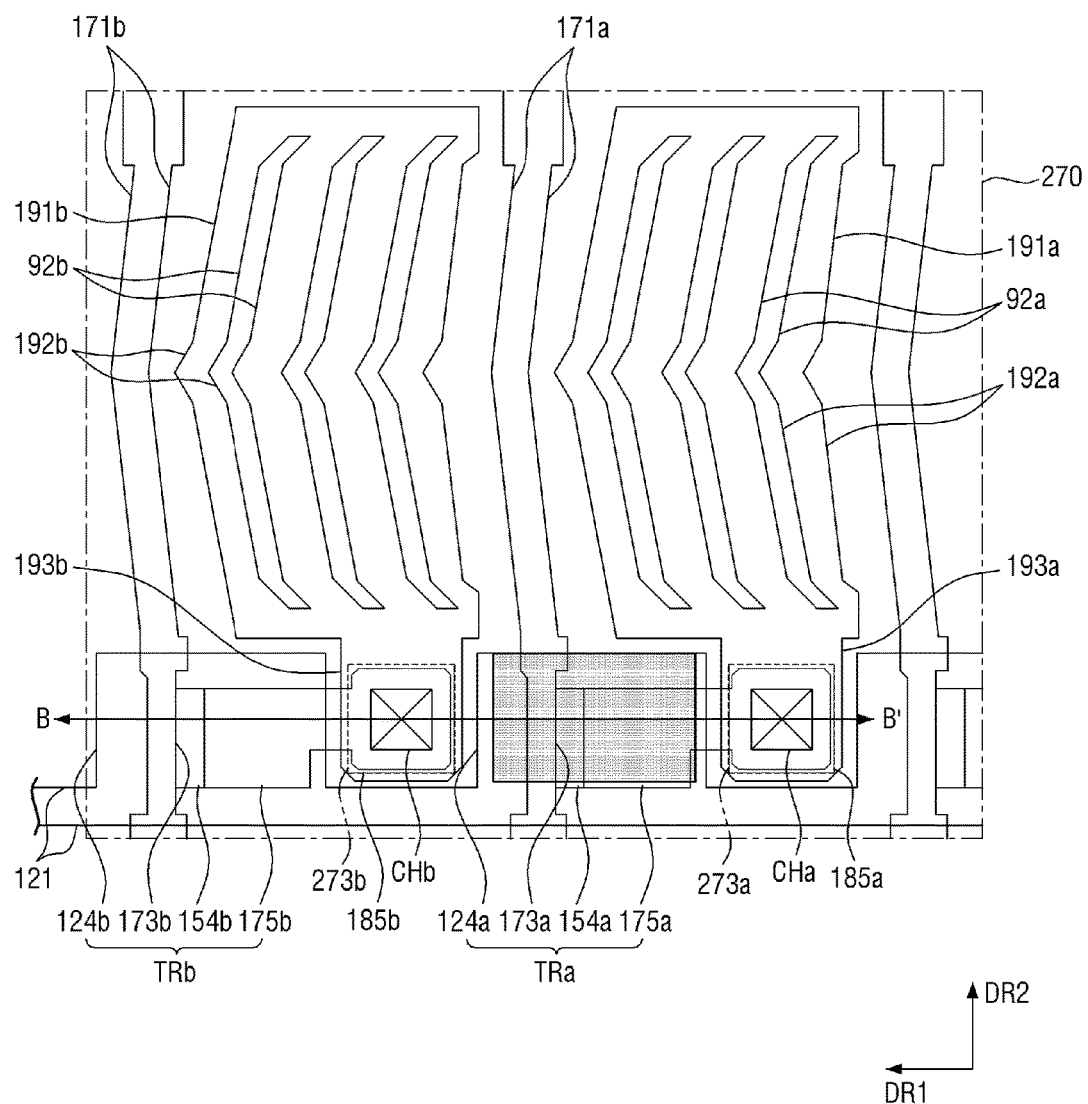
FIG. 5 is a layout view of two pixels included in a display device according to an embodiment of the inventive concept.
Figure 6:
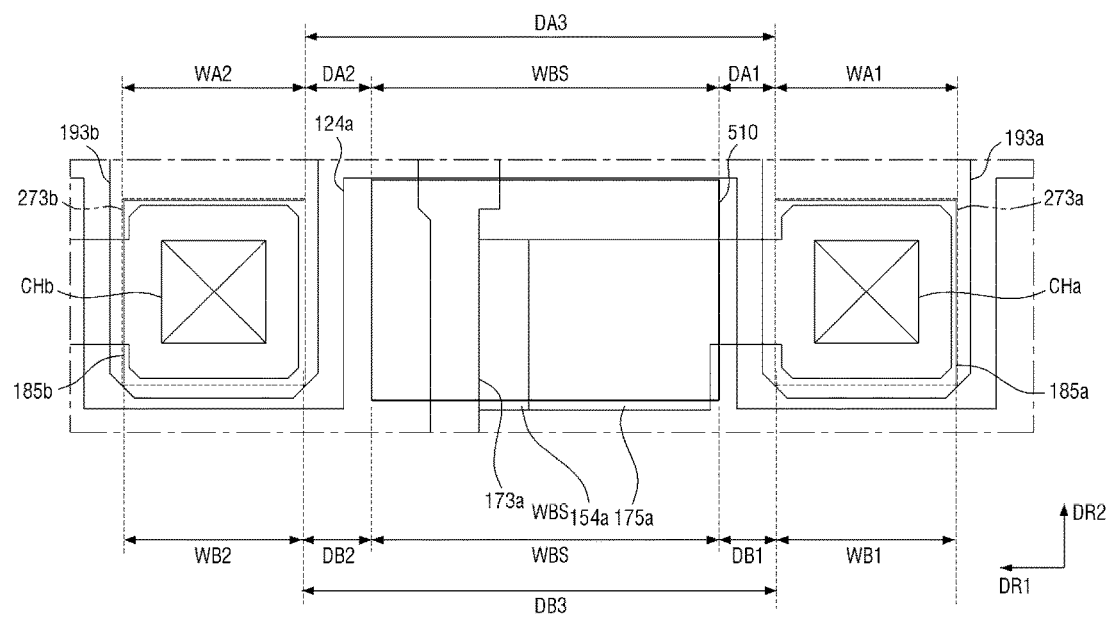
FIG. 6 is an enlarged view of an area around a first contact hole and a second contact hole in the display device of FIG. 5.
Figure 7:
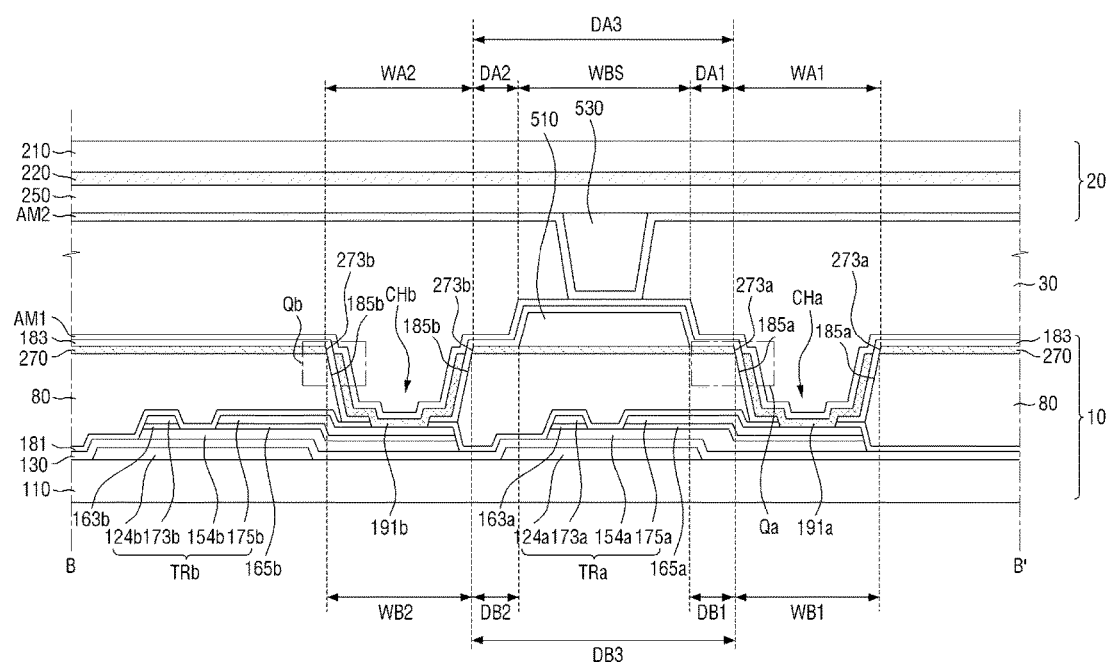
FIG. 7 is a cross-sectional view of the display device taken along the line B-B' of FIG. 5.
Figure 8:
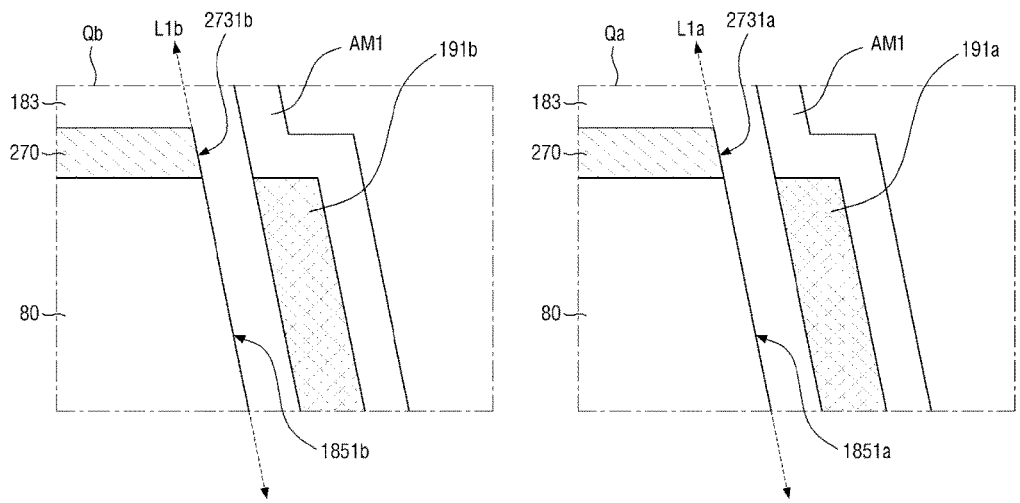
FIG. 8 is an enlarged cross-sectional view of portions Qa and Qb of FIG. 7.

FIG. 5 is a layout view of two pixels included in a display device according to an embodiment of the inventive concept. FIG. 6 is an enlarged view of an area around a first contact hole CHa and a second contact hole CHb in the display device of FIG. 5. FIG. 7 is a cross-sectional view of the display device taken along the line B-B' of FIG. 5. FIG. 8 is an enlarged cross-sectional view of portions Qa and Qb of FIG. 7.

Referring to FIGS. 5 through 8, the display device according to the current embodiment may include a first substrate 10, a second substrate 20, a liquid crystal layer 30, and a spacer 530 as described above.

The first substrate 10 will hereinafter be described based on two pixels.

A gate line 121, a first gate electrode 124a, and a second gate electrode 124b may be located on a first base 110. The gate line 121 may extend substantially in a first direction DR1. The first gate electrode 124a and the second gate electrode 124b may protrude from the gate line 121 and may be connected to the gate line 121.

A gate insulating layer 130 may be located on the gate line 121, the first gate electrode 124a, and the second gate electrode 124b.

A first semiconductor layer 154a and a second semiconductor layer 154b may be located on the gate insulating layer 130.

A first semiconductor layer 154a and a second semiconductor layer 154b may be located on the gate insulating layer 130. At least part of the first semiconductor layer 154a may overlap the first gate electrode 124a, and at least part of the second semiconductor layer 154b may overlap the second gate electrode 124b.

A plurality of first ohmic contact members 163a and 165a may be located on the first semiconductor layer 154a, and a plurality of second ohmic contact members 163b and 165b may be located on the second semiconductor layer 154b. The first ohmic contact members 163a and 165a may include a first source ohmic contact member 163a and a first drain ohmic contact member 165a, and the second ohmic contact members 163b and 165b may include a second source ohmic contact member 163b and a second drain ohmic contact member 165b.

A first source electrode 173a may be located on the first source ohmic contact member 163a, and a first drain electrode 175a may be located on the first drain ohmic contact member 165a. A second source electrode 173b may be located on the second source ohmic contact member 163b, and a second drain electrode 175b may be located on the second drain ohmic contact member 165b.

A first data line 171a and a second data line 171b may be located on the gate insulating layer 130.

The first data line 171a and the second data line 171b may be disposed side by side with each other along the first direction DR1 and extend in a second direction DR2 to cross the gate line 121.

When the first semiconductor layer 154a and the second semiconductor layer 154b are oxide semiconductors, the first ohmic contact members 163a and 165a and the second ohmic contact members 163b and 165b can be omitted.

The first gate electrode 124a, the first source electrode 173a and the first drain electrode 175a may form a first TFT TRa together with the first semiconductor layer 154a, and the second gate electrode 124b, the second source electrode 173b and the second drain electrode 175b may form a second TFT TRb together with the second semiconductor layer 154b. The first TFT TRa and the second TFT TRb may be disposed adjacent to each other along the first direction DR1 as illustrated in FIG. 5.

A passivation layer 181 may be located on the first TFT TRa and the second TFT TRb.

An organic layer 80 may be located on the passivation layer 181.

The organic layer 80 may include a first opening 185a which overlaps the first drain electrode 175a and a second opening 185b which overlaps the second drain electrode 175b.

A common electrode 270 may be located on the organic layer 80. The common electrode 270 located in two adjacent pixels may be connected to receive a common voltage of a certain magnitude from an external source.

The common electrode 270 may include a first common electrode opening 273a and a second common electrode opening 273b. The first common electrode opening 273a may overlap the first drain electrode 175a and the first opening 185a, and the second common electrode opening 273b may overlap the second drain electrode 175b and the second opening 185b.

A planar shape of the first common electrode opening 273a may be substantially identical to that of the first opening 185a as illustrated in FIGS. 5 and 6. When seen from above (or when seen in a plan view), the area of the first common electrode opening 273a may be substantially equal to that of the first opening 185a. Likewise, a planar shape of the second common electrode opening 273b may be substantially identical to that of the second opening 185b as illustrated in FIGS. 5 and 6. When seen from above (when seen in a plan view), the area of the second common electrode opening 273b may be substantially equal to that of the second opening 185b.

In some embodiments, a side surface 2731a of the first common electrode opening 273a and a side surface 1851a of the first opening 185a may lie on substantially the same straight line L1a, and a side surface 2731b of the second common electrode opening 273b and a side surface 1851b of the second opening 185b may lie on substantially the same straight line L1b.

A maximum width WB1 of the first opening 185a and a maximum width WA1 of the first common electrode opening 273a may be substantially equal, and a maximum width WB2 of the second opening 185b and a maximum width WA2 of the second common electrode opening 273b may be substantially equal. For example, assuming that each of the first opening 185a, the second opening 185b, the first common electrode opening 273a and the second common electrode opening 273b has the maximum width WB1, WB2, WA1, or WA2 along the first direction DR1 when seen from above, the maximum width WA1 of the first common electrode opening 273a may be substantially equal to the maximum width WB1 of the first opening 185a. In addition, the maximum width WA2 of the second common electrode opening 273b may be substantially equal to the maximum width WB2 of the second opening 185b.

A bump spacer 510 which protrudes toward the second substrate 20 may be located on the common electrode 270.

The bump spacer 510 may overlap the first TFT TRa and may not overlap the first opening 185a, the second opening 185b, the first common electrode opening 273a, and the second common electrode opening 273b.

The bump spacer 510, the first common electrode opening 273a, and the second common electrode opening 273b may be formed by a single mask process using a halftone mask. Therefore, in some embodiments, a minimum distance DA1 between the bump spacer 510 and the first common electrode opening 273a may be substantially equal to a minimum distance DA2 between the bump spacer 510 and the second common electrode opening 273b.

The first opening 185a and the second opening 185b may be formed by patterning the organic layer 80 using the common electrode 270 having the first common electrode opening 273a and the second common electrode opening 273b as a mask. That is, the bump spacer 510, the first common electrode opening 273a, the second common electrode opening 273b, the first opening 185a and the second opening 185b may be formed by a single mask process using a halftone mask. Therefore, in some embodiments, a minimum distance DB1 between the bump spacer 510 and the first opening 185a may be substantially equal to a minimum distance DB2 between the bump spacer 510 and the second opening 185b.

Further, the minimum distance DA1 between the bump spacer 510 and the first common electrode opening 273a may be substantially equal to the minimum distance DB1 between the bump spacer 510 and the first opening 185a. Similarly, the minimum distance DA2 between the bump spacer 510 and the second common electrode opening 273b may be substantially equal to the minimum distance DB2 between the bump spacer 510 and the second opening 185b.

When a distance between the first common electrode opening 273a and the second common electrode opening 273b measured along the first direction DR1 is a minimum distance DA3, the minimum distance DA3 between the first common electrode opening 273a and the second common electrode opening 273b may have a value equal to or greater than a maximum width WBS of the bump spacer 510 along the first direction DR1.

Similarly, when a distance between the first opening 185a and the second opening 185b measured along the first direction DR1 is a minimum distance DB3, the minimum distance DB3 between the first opening 185a and the second opening 185b may have a value equal to or greater than the maximum width WBS of the bump spacer 510 along the first direction DR1.

An insulating layer 183 may be located on the common electrode 270 and the bump spacer 510 to cover the common electrode 270 and the bump spacer 510.

The first contact hole CHa which exposes the first drain electrode 175a and the second contact hole CHb which exposes the second drain electrode 175b may be formed in the passivation layer 181 and the insulating layer 183. The first contact hole CHa may overlap the first opening 185a and the first common electrode opening 273a, and the second contact hole CHb may overlap the second opening 185b and the second common electrode opening 273b.

A first pixel electrode 191a and a second pixel electrode 191b may be located on the insulating layer 183. The first pixel electrode 191a and the second pixel electrode 191b may be insulated from the common electrode 270 with the insulating layer 183 interposed therebetween, and at least part of each of the first pixel electrode 191a and the second pixel electrode 191b may overlap the common electrode 270. The first pixel electrode 191a may include a plurality of branch electrodes 192a, and a slit 92a may be formed between each pair of neighboring branch electrodes 192a. Likewise, the second pixel electrode 191b may include a plurality of branch electrodes 192b, and a slit 92b may be formed between each pair of neighboring branch electrodes 192b.

The first pixel electrode 191a may include a first extension part 193a, and the first extension part 193a may be physically and electrically connected to the first drain electrode 175a by the first contact hole CHa, the first opening 185a, and the first common electrode opening 273a. Likewise, the second pixel electrode 191b may include a second extension part 193b, and the second extension part 193b may be physically and electrically connected to the second drain electrode 175b by the second contact hole CHb, the second opening 185b, and the second common electrode opening 273b.

A first alignment layer AM1 may further be located on the insulating layer 183, the first pixel electrode 191a, and the second pixel electrode 191b.

The second substrate 20 may include a second base 210, a light-blocking member 220 and a plurality of color fillers and may further include an overcoat layer 250.

The spacer 530 may be located between the first substrate 10 and the second substrate 20. The spacer 530 may overlap the bump spacer 510 and the light-blocking member 220.

The second substrate 20 and the spacer 530 are identical to those described above, and thus a description thereof is omitted.

That is, the first opening 185a, the second opening 185b, the first common electrode opening 273a, the second common electrode opening 273b and the bump spacer 510 included in the display device according to the current embodiment can be formed using a single mask process. Therefore, the process of manufacturing the display device can be simplified.

FIGS. 9 through 18 are cross-sectional views illustrating steps of a process of manufacturing the display device of FIG. 7.

Figure 9:
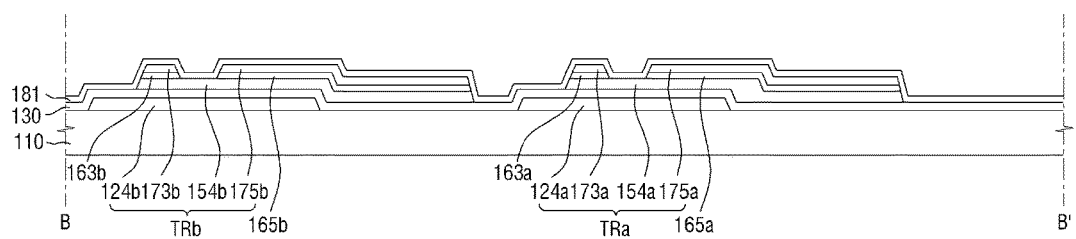
FIGS. 9, 10, 11, 12, 13, 14, 15, 16, 17, and 18 are cross-sectional views illustrating steps of a process of manufacturing the display device of FIG. 7.

Referring to FIGS. 9 through 18, a first TFT TRa and a second TFT TRb are formed on a first base 110, and a passivation layer 181 is formed on the first base 110 to cover the first TFT TRa and the second TFT TRb as illustrated in FIG. 9. Specific components of each of the first TFT TRa and the second TFT TRb is identical to those described above with reference to FIGS. 5 through 8.

Figure 10:
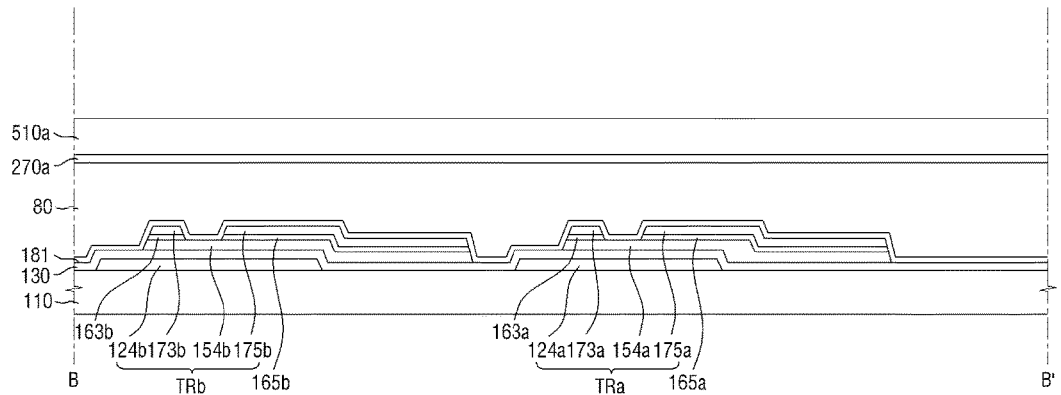

Referring to FIG. 10, an organic layer 80 is formed on the passivation layer 181 to a desired thickness, and a common electrode conductive layer 270a is formed on the organic layer 80. In addition, a bump organic layer 510a is formed on the common electrode conductive layer 270a to a desired thickness.

Figure 11:
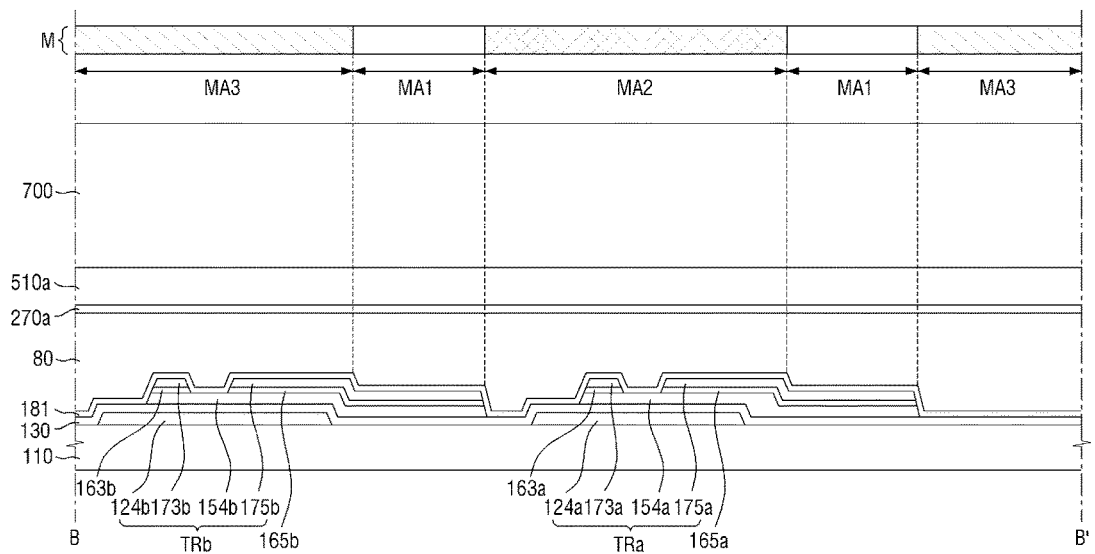

Referring to FIG. 11, a photoresist layer 700 is formed on the bump organic layer 510a. The photoresist layer 700 may be negative photoresist or positive photoresist. For ease of description, a case where the photoresist layer 700 is a positive photoresist will hereinafter be described as an example.

Next, a mask M is placed on the photoresist layer 700, the photoresist layer 700 is irradiated with light, selectively through the mask M. The mask M includes a light-transmitting area MA1 which transmits all of the irradiating light, a light-blocking area MA2 which blocks all of the irradiating light, and a transflective area MA3 which transmits some of the irradiating light and blocks the rest of the irradiating light. That is, the mask M may be a multi-tone mask such as a halftone mask. Here, the light-transmitting area MA1 may correspond to a first common electrode opening and a second common electrode opening which will be described later, and the light-blocking area MA2 may correspond to a bump spacer which will be described later. In addition, the transflective area MA3 may be an area excluding the light-transmitting area MA1 and the light-blocking area MA2.

Figure 12:
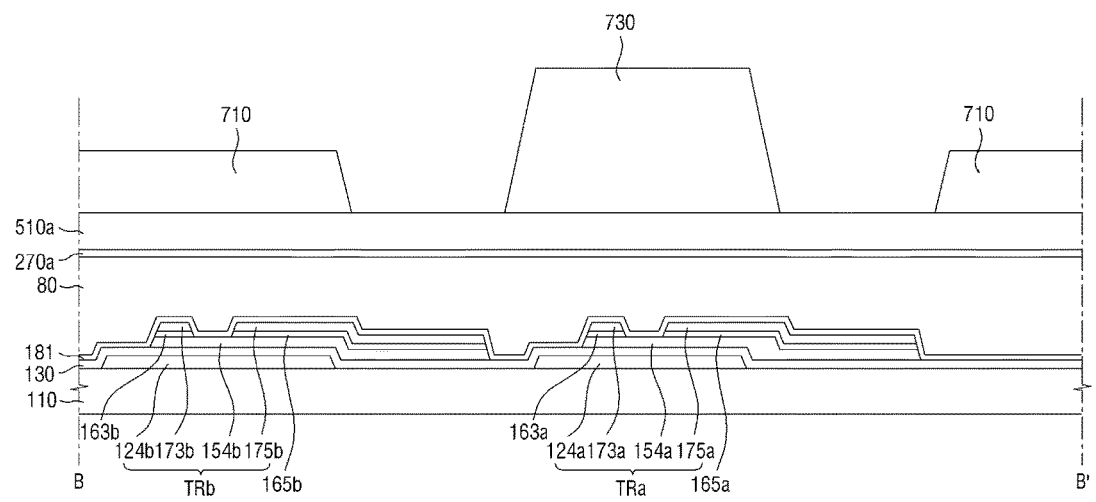

Next, the photoresist layer 700 exposed to light through the mask M is developed. Then, a first photoresist pattern 710 is formed in a portion corresponding to the transflective area MA3 as illustrated in FIG. 12, and a second photoresist pattern 730 is formed in a portion corresponding to the light-blocking area MA2 as illustrated in FIG. 12. In addition, a portion of the photoresist layer 700 which corresponds to the light-transmitting area MA1 is removed to partially expose the bump organic layer 510a as illustrated in FIG. 12. Here, the photoresist pattern 730 formed in the portion corresponding to the light-blocking area MA2 is thicker than the first photoresist pattern 710 formed in the portion corresponding to the transflective area MA3. This is because positive photoresist was used as the photoresist layer 700.

Figure 13:
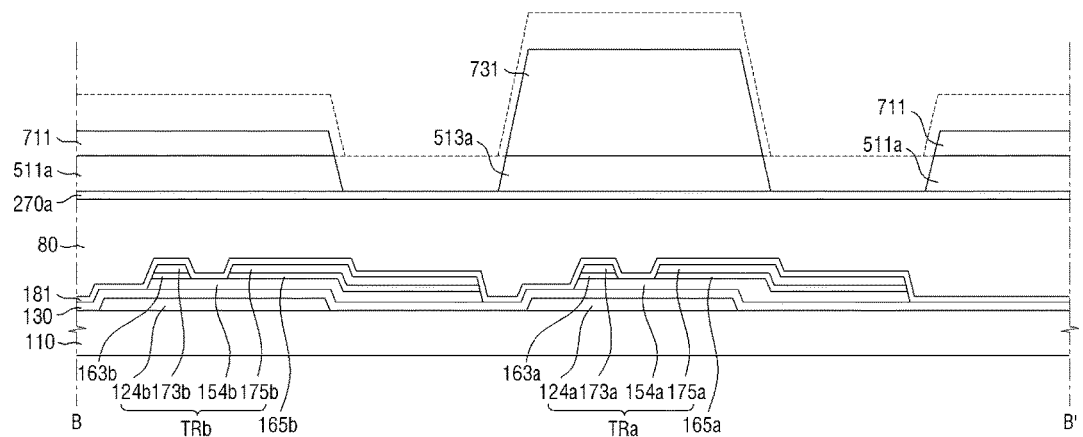

Next, the bump organic layer 510a is patterned using the first photoresist pattern 710 and the second photoresist pattern 730 as a mask. In some embodiments, the process of patterning the bump organic layer 510a may be accomplished by an etching process using oxygen plasma. In some embodiments, the first photoresist pattern 710 and the second photoresist pattern 730 may be partially etched in the process of patterning the bump organic layer 510a. For example, the first photoresist pattern 710 may become a third photoresist pattern 711 with a reduced thickness and/or width as illustrated in FIG. 13, and the second photoresist pattern 730 may become a fourth photoresist pattern 731 with a reduced thickness and/or width as illustrated in FIG. 13. In addition, a first bump organic layer pattern 511a formed by patterning the bump organic layer 510a may be disposed under the third photoresist pattern 711, and a second bump organic layer pattern 513a formed by patterning the bump organic layer 510a may be disposed under the fourth photoresist pattern 731. Further, portions of the bump organic layer 510a which are not covered by the first photoresist pattern 710 and the second photoresist pattern 730 or the third photoresist pattern 711 and the fourth photoresist pattern 731 may be removed as illustrated in FIG. 13. Accordingly, the common electrode conductive layer 270a may be exposed between the first bump organic layer pattern 511a and the second bump organic layer pattern 513a.

Figure 14:
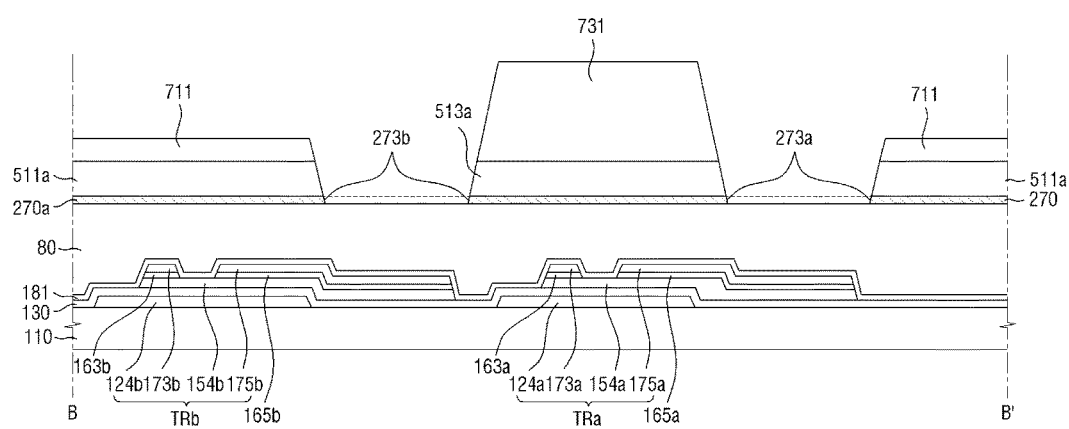

Next, the common electrode conductive layer 270a is etched using the third photoresist pattern 711 and the fourth photoresist pattern 731 as a mask, thereby forming a common electrode 270 having a first common electrode opening 273a and a second common electrode opening 273b as illustrated in FIG. 14. The organic layer 80 is partially exposed through the first common electrode opening 273a and the second common electrode opening 273b.

Next, the organic layer 80 is patterned using the common electrode 270 as a mask. Here, the portion of the organic layer 80 exposed through the first common electrode opening 273a and the second common electrode opening 273b may be removed, resulting in the formation of a first opening 185a and a second opening 185b in the organic layer 80 as illustrated in FIG. 15.

The first opening 185a and the second opening 185b are substantially formed using the common electrode 270 having the first common electrode opening 273a and the second common electrode opening 273b as a mask. Therefore, a planar shape of the first common electrode opening 273a may be substantially identical to that of the first opening 185a, and a planar shape of the second common electrode opening 273b may be substantially identical to that of the second opening 185b. In addition, a maximum width of the first common electrode opening 273a may be substantially equal to that of the first opening 185a, and a maximum width of the second common electrode opening 273b may be substantially equal to that of the second opening 185b. Further, as described above with reference to FIGS. 5 through 8, an inner side surface of the first common electrode opening 273a and an inner side surface of the first opening 185a may be substantially collinear, and an inner side surface of the second common electrode opening 273b and an inner side surface of the second opening 185b may be substantially collinear.

Figure 15:
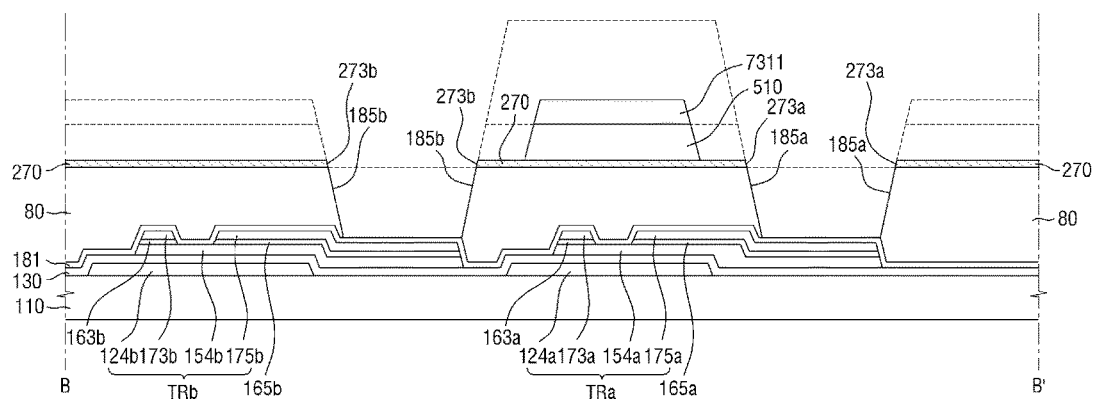

The process of patterning the organic layer 80 may be accomplished by an ashing process, and the third photoresist pattern 711 and the first bump organic layer pattern 511a may be removed in the process of patterning the organic layer 80 as illustrated in FIG. 15. That is, the process of patterning the organic layer 80 and the process of removing the third photoresist pattern 711 and the first bump organic layer pattern 511a may be performed simultaneously.

In addition, in the process of patterning the organic layer 80, the fourth photoresist pattern 731 may become a fifth photoresist pattern 7311 with a reduced thickness and width as illustrated in FIG. 15, and a width of the second bump organic layer pattern 513a may be reduced to form a bump spacer 510 under the fifth photoresist pattern 7311 as illustrated in FIG. 15.

That is, the process of patterning the organic layer 80 may be performed at the same time as the process of forming the bump spacer 510 as well as the process of removing the third photoresist pattern 711 and the first bump organic layer pattern 511a.

Figure 16:
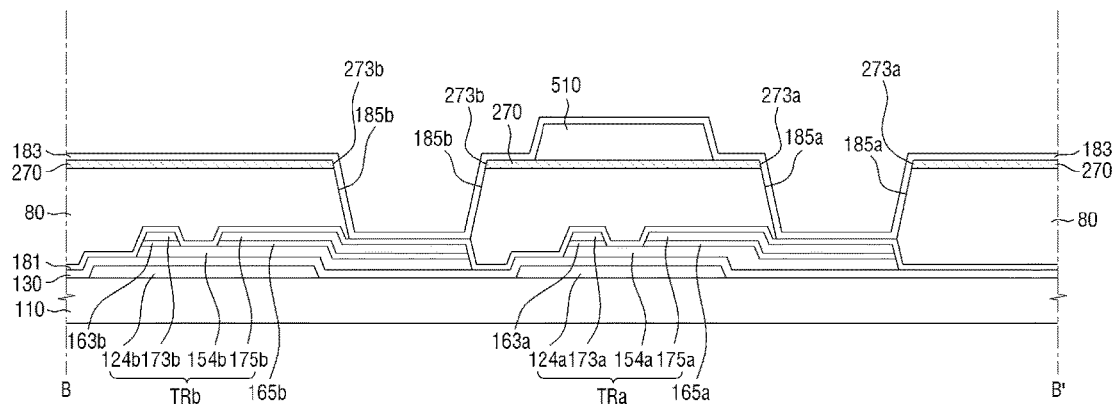

Next, after the fifth photoresist pattern 7311 is removed by a stripping process, an insulating layer 183 is formed on the whole surface of the first base 110 having the organic layer 80, the common electrode 270 and the bump spacer 510 as illustrated in FIG. 16.

Figure 17:
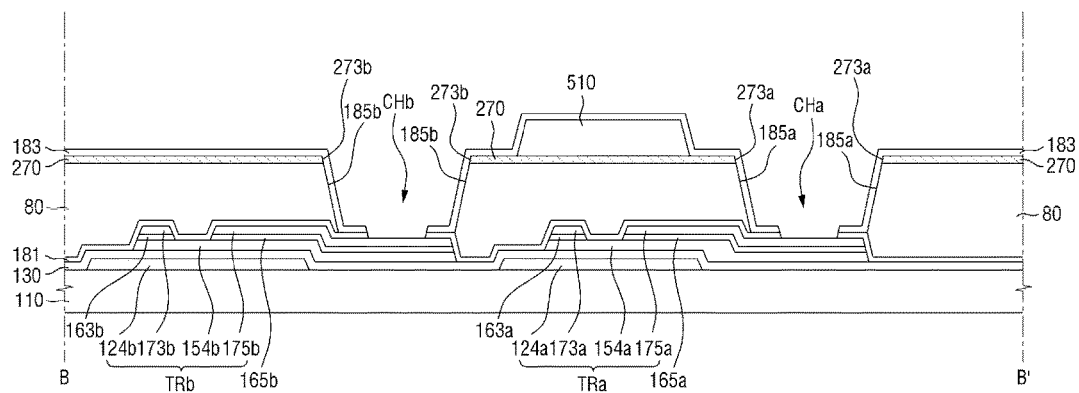

Referring to FIG. 17, a first contact hole CHa which exposes a first drain electrode 175a and a second contact hole CHb which exposes a second drain electrode 175b are formed in the insulating layer 183 and the passivation layer 181.

Figure 18:
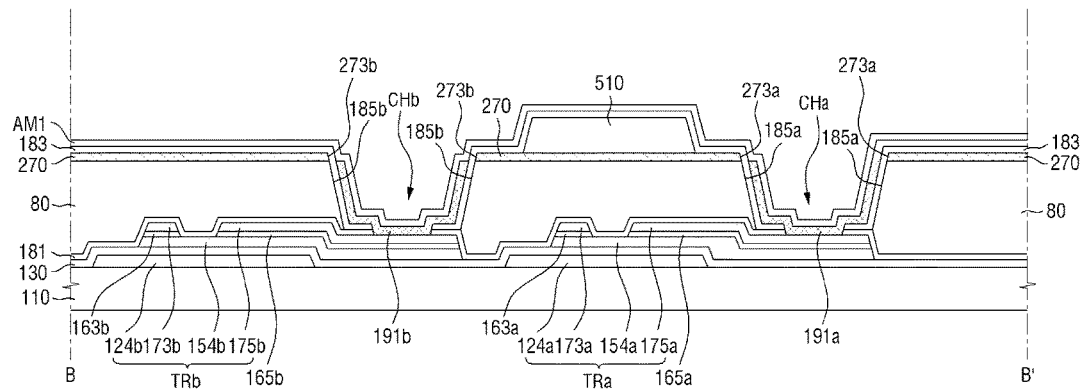

Referring to FIG. 18, a first pixel electrode 191a which is connected to the first drain electrode 175a and a second pixel electrode 191b which is connected to the second drain electrode 175b are formed on the insulating layer 183.

Then, a first alignment layer AM1 is formed on the whole surface of the first base 110 having the first pixel electrode 191a and the second pixel electrode 191b, thereby producing a first substrate 10 (see FIG. 7). A second substrate 20 (see FIG. 7) and a spacer 530 (see FIG. 7) are placed on the first substrate 10 (see FIG. 7), and a liquid crystal layer 30 is injected between the first substrate 10 (see FIG. 7) and the second substrate 20 (see FIG. 7) to produce the display device of FIG. 7.

According to the above-described embodiment of the inventive concept, the first and second openings 185a and 185b of the organic layer 80, the first and second common electrode openings 273a and 273b of the common electrode 270, and the bump spacer 510 are formed by a single mask process using a halftone mask. Therefore, the number of masks used in the process of manufacturing a display device can be reduced.

Since the first and second openings 185a and 185b of the organic layer 80 and the first and second common electrode openings 273a and 273b of the common electrode 270 are formed by a single mask process, there is no need to consider margins between the first and second openings 185a and 185b and the first and second common electrode openings 273a and 273b. This can reduce the area occupied by the first and second openings 185a and 185b and the first and second common electrode openings 273a and 273b in a display device and improve an aperture ratio of the display device. In addition, since there is no need to consider the margins between the first and second openings 185a and 185b and the first and second common electrode openings 273a and 273b, it is easy to realize a high-resolution display device.

Also, according to the above-described embodiment, the thickness of each of the bump spacer 510 and the organic layer 80 can be easily adjusted to a desired thickness. Accordingly, a desired gap can be formed and maintained between the first substrate 10 and the second substrate 20, thus preventing degradation of display quality and providing a display device with improved reliability.

According to embodiments of the inventive concept, a display device which can maintain a uniform gap between two substrates and a method of manufacturing the display device can be provided.

In addition, according to embodiments of the inventive concept, a display device which can reduce the number of manufacturing processes and a method of manufacturing the display device can be provided.

However, the effects of the inventive concept are not restricted to the one set forth herein. The above and other effects of the inventive concept will become more apparent to one of daily skill in the art to which the inventive concept pertains by referencing the claims.

Although the exemplary embodiments of the inventive concept have been disclosed for illustrative purposes, the embodiments are only exemplified, but do not limit the inventive concept. Those skilled in the art will appreciate that various modifications and applications are possible, without departing from the scope and spirit of the inventive concept as disclosed in the accompanying claims. For example, each element specified in embodiments of the inventive concept can be variously modified and implemented. Further, differences related to such modifications and applications should be interpreted as being included in the scope of the inventive concept defined by the accompanying claims.

What is claimed is:

1. A display device comprising:
    a first base;
    a first thin-film transistor (TFT) and a second TFT which are disposed on the first base to be adjacent to each other along a first direction;
    an organic layer which covers the first TFT and the second TFT and comprises a first opening overlapping a first drain electrode of the first TFT and a second opening overlapping a second drain electrode of the second TFT;
    a common electrode which is located on the organic layer and comprises a first common electrode opening overlapping the first opening and a second common electrode opening overlapping the second opening;
    a bump spacer which is located on the common electrode;
    an insulating layer which is located on the common electrode and the bump spacer;
    a first pixel electrode which is disposed on the insulating layer to overlap the common electrode and is electrically connected to the first TFT; and
    a second pixel electrode which is disposed on the insulating layer to overlap the common electrode and is electrically connected to the second TFT,
    wherein a minimum distance between the bump spacer and the first common electrode opening is equal to a minimum distance between the bump spacer and the second common electrode opening in a plan view,
    wherein the bump spacer and the insulating layer are formed of different materials.

2. The display device of claim 1, wherein a planar shape of the first opening is identical to that of the first common electrode opening, and a planar shape of the second opening is identical to that of the second common electrode opening.

3. The display device of claim 2, wherein a side surface of the first opening and a side surface of the first common electrode opening are collinear, and a side surface of the second opening and a side surface of the second common electrode opening are collinear.

4. The display device of claim 2, wherein a maximum width of the first common electrode opening in the first direction is equal to that of the first opening in the first direction, and a maximum width of the second common electrode opening in the first direction is equal to that of the second opening in the first direction.

5. The display device of claim 2, wherein the bump spacer does not overlap the first common electrode opening nor the second common electrode opening.

6. The display device of claim 2, wherein a minimum distance between the first common electrode opening and the second common electrode opening is equal to or greater than a width of the bump spacer in the first direction.

7. The display device of claim 2, wherein a minimum distance between the bump spacer and the first opening is equal to a minimum distance between the bump spacer and the second opening.

8. The display device of claim 2, wherein the insulating layer comprises a first contact hole which exposes the first drain electrode and overlaps the first opening and the first common electrode opening and a second contact hole which exposes the second drain electrode and overlaps the second opening and the second common electrode opening, wherein the first pixel electrode is connected to the first drain electrode of the first TFT by the first contact hole, the first common electrode opening and the first opening, and wherein the second pixel electrode is connected to the second drain electrode of the second TFT by the second contact hole, the second common electrode opening and the second opening.

9. The display device of claim 1, further comprising:
    a gate line which is located on the first base and extends in the first direction; and
    a first data line and a second data line which are located on the first base and insulated from the gate line to extend in a second direction intersecting the first direction, wherein the first TFT is electrically connected to the gate line and the first data line, and the second TFT is electrically connected to the gate line and the second data line.

10. The display device of claim 1, further comprising:
    a second base which faces the first base; and a spacer which is located on a surface of the second base facing the first base and which overlaps the bump spacer, wherein the spacer is protruded toward the first base.

11. The display device of claim 10, further comprising:

a first alignment layer which is located on the insulating layer and covers the first pixel electrode and the second pixel electrode; and a second alignment layer which is located on the surface of the second base and covers the spacer, wherein the first alignment layer and the second alignment layer directly contact each other between the spacer and the bump spacer.

12. A display device comprising:

a first base;

a TFT which is located on the first base;

an organic layer which covers the TFT and has an opening overlapping a drain electrode of the TFT;

a common electrode which is located on the organic layer and has a common electrode opening overlapping the opening;

a bump spacer which is located on the common electrode;

an insulating layer which is located on the common electrode and the bump spacer; and a pixel electrode which is disposed on the insulating layer to overlap the common electrode and is electrically connected to the TFT, wherein a planar shape of the opening is identical to that of the common electrode opening, wherein the bump spacer and the insulating layer are formed of different materials.

13. The display device of claim 12, wherein a side surface of the common electrode opening and a side surface of the opening are collinear.

14. The display device of claim 12, wherein the bump spacer does not overlap the common electrode opening.

15. The display device of claim 12, wherein a maximum width of the common electrode opening is equal to that of the opening.

16. The display device of claim 12, further comprising:

a second base which faces the first base; and a spacer which is located on a surface of the second base facing the first base and overlaps the bump spacer.

17. The display device of claim 16, further comprising:

a first alignment layer which is located on the insulating layer and covers the pixel electrode; and a second alignment layer which is located on the surface of the second base and covers the spacer, wherein the first alignment layer and the second alignment layer contact each other between the spacer and the bump spacer.

* * * * *